(12) United States Patent
Chun

(10) Patent No.: US 10,860,248 B2
(45) Date of Patent: Dec. 8, 2020

(54) ELECTRONIC DEVICE WITH CONTROL BASED ON VOLTAGE ABNORMALITY, MEMORY SYSTEM HAVING THE SAME, AND OPERATING METHOD THEREOF

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 93 days.

(21) Appl. No.: 16/178,111

(22) Filed: Nov. 1, 2018

(65) Prior Publication Data

US 2019/0294370 A1 Sep. 26, 2019

(30) Foreign Application Priority Data

Mar. 26, 2018 (KR) .................. 10-2018-0034678

(51) Int. Cl.
*G06F 3/06* (2006.01)
*G11C 16/04* (2006.01)
*H01L 27/11556* (2017.01)
*H01L 27/11582* (2017.01)

(52) U.S. Cl.
CPC .......... *G06F 3/0659* (2013.01); *G06F 3/0604* (2013.01); *G06F 3/0679* (2013.01); *G11C 16/04* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 8,897,085 | B2 | 1/2014 | Li | |
|---|---|---|---|---|
| 2008/0112236 | A1* | 5/2008 | Takase | G11C 5/143 365/195 |
| 2012/0079353 | A1* | 3/2012 | Liikanen | G06F 11/1048 714/773 |
| 2014/0380096 | A1* | 12/2014 | Dodson | G06F 11/1402 714/16 |

FOREIGN PATENT DOCUMENTS

KR   1020100088922   8/2010

* cited by examiner

*Primary Examiner* — Edward J Dudek, Jr.
*Assistant Examiner* — Ralph A Verderamo, III
(74) *Attorney, Agent, or Firm* — IP & T Group LLP

(57) ABSTRACT

Provided herein may be an electronic device, a memory system having the electronic device, and an operating method thereof. The electronic device may include a voltage manager configured to determine whether a voltage abnormality occurs by monitoring a voltage to be supplied to a target device, and an operation manager configured to perform an operation control of the target device, and re-perform, when the voltage manager determines that the voltage abnormality has occurred, the operation control being performed at a time of the occurrence of the voltage abnormality.

16 Claims, 14 Drawing Sheets

| OPERATION PROCEEDING STATUS INFORMATION | | | | | |
|---|---|---|---|---|---|
| CMD 3 | UNTRANSMITTED | ... | ... | ... | ... |
| CMD 2 | UNTRANSMITTED | ADD 2 | UNTRANSMITTED | ... | ... |
| CMD 1 | TRANSMITTED | ADD 1 | TRANSMITTING | DATA 1 | UNTRANSMITTED |

ELECTRONIC DEVICE WITH CONTROL BASED ON VOLTAGE ABNORMALITY, MEMORY SYSTEM HAVING THE SAME, AND OPERATING METHOD THEREOF

CROSS-REFERENCE TO RELATED APPLICATION

The present application claims priority under 35 U.S.C. § 119(a) to Korean patent application number 10-2018-0034678, filed on Mar. 26, 2018, which is incorporated herein by reference in its entirety.

BACKGROUND

1. Field of Invention

Various embodiments of the present disclosure generally relate to an electronic device. Particularly, the embodiments relate to an electronic device configured to control an operation of a target device having voltage abnormality, a memory system having the electronic device, and an operating method thereof.

2. Description of Related Art

Memory systems may include a memory device and a memory controller.

The memory device may store data or output the stored data, under control of the memory controller. For example, the memory device is implemented as a volatile memory device in which data stored therein is lost when power is turned off, or a nonvolatile memory device which can retain data stored therein even when power supply is interrupted.

The memory controller may control data communication between a host and the memory device.

The host may communicate with the memory system using an interface protocol such as a peripheral component interconnect-express (PCI-e or PCIe) protocol, an advanced technology attachment (ATA) protocol, an serial ATA (SATA) protocol, a parallel ATA (PATA) protocol, or an serial attached SCSI (SAS) protocol. The interface protocol between the host and the memory system is not limited to the above-mentioned examples. For instance, the host may communicate with the memory system using various interfaces such as a universal serial bus (USB), a multi-media card (MMC), an enhanced small disk interface (ESDI), and integrated drive electronics (IDE).

SUMMARY

Various embodiments of the present disclosure are directed to an electronic device configured to control an operation of a target device having voltage abnormality, a memory system having the electronic device, and an operating method thereof.

An embodiment of the present disclosure may provide for an electronic device including a voltage manager configured to determine whether a voltage abnormality occurs by monitoring a voltage to be supplied to a target device, and an operation manager configured to perform an operation control of the target device, and re-perform, when the voltage manager determines that the voltage abnormality has occurred, the operation control being performed at a time of the occurrence of the voltage abnormality.

An embodiment of the present disclosure may provide for a memory system including a memory device configured to store data, and a memory controller configured to determine whether a voltage abnormality occurs by monitoring a voltage to be supplied to the memory device while performing an operation control of the memory device, and re-perform, when it is determined that the voltage abnormality has occurred, the operation control being performed at a time of the occurrence of the voltage abnormality.

An embodiment of the present disclosure may provide for a method of operating a memory controller, including performing operation control of a memory device, determining whether voltage abnormality occurs by monitoring a voltage to be supplied to the memory device, and re-performing the operation control when it is determined that a voltage abnormality has occurred while the operation control is being performed.

An embodiment of the present disclosure may provide for a memory system including a target device configured to operate by one or more voltages, a voltage generator configured to provide the target device with one or more of the voltages, and an electronic device configured to control the target device to operate by providing the target device with a control signal, detect an abnormality in one or more of the voltages, and control, upon detecting the abnormality while providing the control signal, the target device to operate again by providing again the control signal.

DETAILED DESCRIPTION

Figure 1:
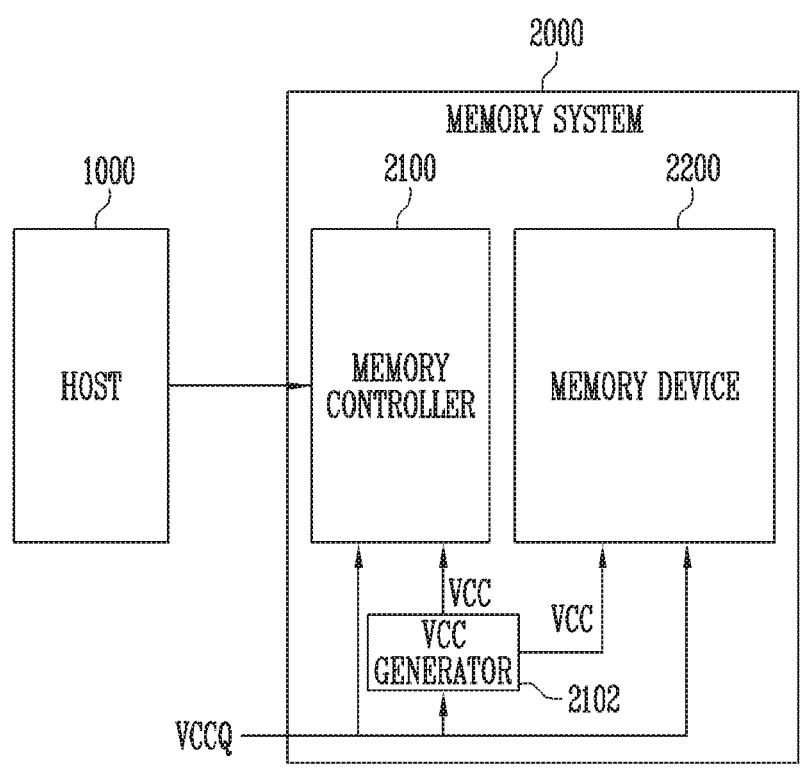
FIG. 1 is a diagram illustrating a memory system in accordance with an embodiment of the present disclosure.

Example embodiments will now be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Moreover, it is noted that reference to "an embodiment" does not necessarily mean only one embodiment, and different references to "an embodiment" are not necessarily to the same embodiment(s).

In the figures, dimensions of the drawings may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, as used herein, singular forms may include plural forms as well and vice versa, unless the context clearly indicates otherwise. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in commonly used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system 2000 in accordance with an embodiment of the present disclosure.

Referring to FIG. 1, the memory system 2000 may include a memory device 2200 configured to store data, and a memory controller 2100 configured to control the memory device 2200 under control of a host 1000.

The host 1000 may communicate with the memory system 2000 using an interface protocol such as a peripheral component interconnect-express (PCI-e or PCIe) protocol, an advanced technology attachment (ATA) protocol, a serial ATA (SATA) protocol, a parallel ATA (PATA) protocol, or a serial attached SCSI (SAS) protocol. In addition, the interface protocol between the host 1000 and the memory system 2000 is not limited to the above-described examples, and may be one of other interface protocols such as a universal serial bus (USB), a multi-media card (MMC), an enhanced small disk interface (ESDI), and integrated drive electronics (IDE).

The memory controller 2100 may control the overall operation of the memory system 2000 and data exchange between the host 1000 and the memory device 2200. For example, the memory controller 2100 may translate received information and store or output the translated information so that a command, an address, and data may be communicated between the host 1000 and the memory device 2200. For instance, during a program operation, the memory controller 2100 may transmit a command, an address, data, etc. to the memory device 2200. During a read operation, the memory controller 2100 may transmit an address and a command for a data sensing operation to the memory device 2200. During a read operation, the memory controller 2100 may transmit a command for outputting sensed data to the memory device 2200.

The memory controller 2100 may monitor an external voltage VCCQ and an internal voltage VCC which are supplied to the memory device 2200. The internal voltage VCC may be a voltage generated from the external voltage VCCQ by a VCC generator 2102. For example, the VCC generator 2102 may be a low drop out (LDO) regulator. A voltage obtained by changing a voltage level of the external voltage VCCQ inputted to the LDO regulator may be an internal voltage VCC. An external voltage VCCQ to be supplied to the memory controller 2100 may be the same as an external voltage VCCQ to be supplied to the memory device 2200. An internal voltage VCC to be supplied to the memory controller 2100 may be the same as an internal voltage VCC to be supplied to the memory device 2200.

Therefore, the monitoring of the external voltage VCCQ and the internal voltage VCC to be supplied to the memory device 2200 may be performed by monitoring the external voltage VCCQ and the internal voltage VCC to be supplied to the memory controller 2100.

The memory controller 2100 may monitor the external voltage VCCQ and the internal voltage VCC to be supplied to the memory device 2200, and may determine whether voltage abnormality has occurred. For example, the memory controller 2100 may determine the voltage abnormality to occur by determining whether the external voltage VCCQ and the internal voltage VCC to be supplied to the memory device 2200 are not in their normal ranges. For instance, voltage abnormality may be determined to occur when the external voltage VCCQ to be supplied to the memory device 2200 drops below a lower threshold value of its normal range, when the external voltage VCCQ to be supplied to the memory device 2200 exceeds an upper threshold value of its normal range, when the internal voltage VCC to be supplied to the memory device 2200 drops below a lower threshold value of its normal range, and when the internal voltage VCC to be supplied to the memory device 2200 exceeds an upper threshold value of its normal range.

The memory controller 2100 may monitor the external voltage VCCQ and the internal voltage VCC to be supplied to the memory device 2200, and may determine whether the voltage abnormality has been removed. In other words, the memory controller 2100 may determine whether the external voltage VCCQ and the internal voltage VCC have been recovered into their normal ranges after voltage abnormality has occurred. For example, the memory controller 2100 may determine whether the external voltage VCCQ and the internal voltage VCC to be supplied to the memory device 2200 has dropped below the normal ranges and thereafter increased into the normal ranges again, or whether the external voltage VCCQ and the internal voltage VCC to be supplied to the memory device 2200 has exceeded the normal ranges and thereafter lowered into the normal ranges again.

The memory controller 2100 may perform operation control of the memory device 2200. The operation control may be performed by transmitting, to the memory device 2200, at least one of a command, an address and data required for an operation of the memory device 2200, and thus the memory device 2200 may perform the operation through the operation control. For example, the memory controller 2100 may perform operation control for a program operation or operation control for a read operation of the memory device 2200. Here, the read operation may include a data sensing operation and a sensed-data output operation and thus the operation control for the read operation may include operation control for a data sensing operation, and operation control for sensed-data output operation.

The memory controller 2100 may check the kind of the operation control, which is being performed for the operation of the memory device 2200 at the time of occurrence of voltage abnormality. For example, the memory controller 2100 may generate at least one command and at least one address corresponding to the at least one command for the operation control of the memory device 2200, and store the at least one command and the at least one address. Furthermore, the memory controller 2100 may manage operation proceeding status information, which is information indicating whether a command, an address, or data corresponding to an operation of the memory device 2200 is being transmitted to the memory device 2200 or has been transmitted thereto. The operation proceeding status information may be stored in an internal memory or in an operation proceeding status manager (shown in FIG. 2) within the memory controller 2100.

The operation proceeding status information may be updated when a command for a new operation of the memory device 2200 is generated. This may mean that a field indicating a transmission status corresponding to the new operation is added to the operation proceeding status information. The operation proceeding status information for an operation of the memory device 2200 may be updated when voltage abnormality does not occur until the operation of the memory device 2200 is completed. This may mean that a field indicating a transmission status corresponding to the operation is removed from the operation proceeding status information. The field indicating the transmission status will be described later with reference to FIG. 8.

When voltage abnormality occurs, the memory controller 2100 may check, with reference to the operation proceeding status information, the kind of the operation control, which is being performed for the operation of the memory device 2200 at the time of the occurrence of the voltage abnormality.

The memory controller 2100 may re-perform the operation control that is being performed on the memory device 2200 at the time of the occurrence of the voltage abnormality. This may be performed after a preset time passes from at the time of the occurrence of the voltage abnormality, or may be performed after the voltage abnormality has been removed. Here, the preset time may be determined through a test operation of the memory system 2000. For example, during a test operation of the memory system 2000, the time taken to recover the abnormal voltage into the normal range after voltage abnormality has occurred may be measured, and the measured time may be determined to be the preset time.

If the operation control being performed on the memory device 2200 at the time of the occurrence of the voltage abnormality is operation control for a program operation, the memory controller 2100 may re-perform the operation control for the corresponding program operation. For example, the memory controller 2100 may re-transmit at least one of a command, an address, and data for the corresponding program operation to the memory device 2200.

If the operation control being performed on the memory device 2200 at the time of the occurrence of the voltage abnormality is operation control for a read operation, the memory controller 2100 may re-perform the operation control for the corresponding read operation. For example, the memory controller 2100 may re-transmit at least one of a command and an address for the corresponding read operation to the memory device 2200. For example, if the operation control being performed on the memory device 2200 at the time of the occurrence of the voltage abnormality is operation control for a data sensing operation, the memory controller 2100 may transmit at least one of a command and an address for the corresponding data sensing operation to the memory device 2200. For example, if the operation control being performed on the memory device 2200 at the time of the occurrence of the voltage abnormality is operation control for a sensed-data output operation, the memory controller 2100 may transmit a command for the corresponding sensed-data output operation to the memory device 2200.

The memory device 2200 may perform an operation under control of the memory controller 2100. For example, the memory device 2200 may perform a program operation, a read operation, an erase operation, a suspend operation, a copy-back operation, and so forth. The read operation may include at least one of a data sensing operation and a sensed-data output operation.

The memory device 2200 may be formed of a volatile memory device in which data stored therein is lost when power is turned off, or a nonvolatile memory device which can retain data stored therein even when power supply is interrupted. The following description for embodiments will be made for an example where a flash memory included in the nonvolatile memory device is used.

Figure 2:
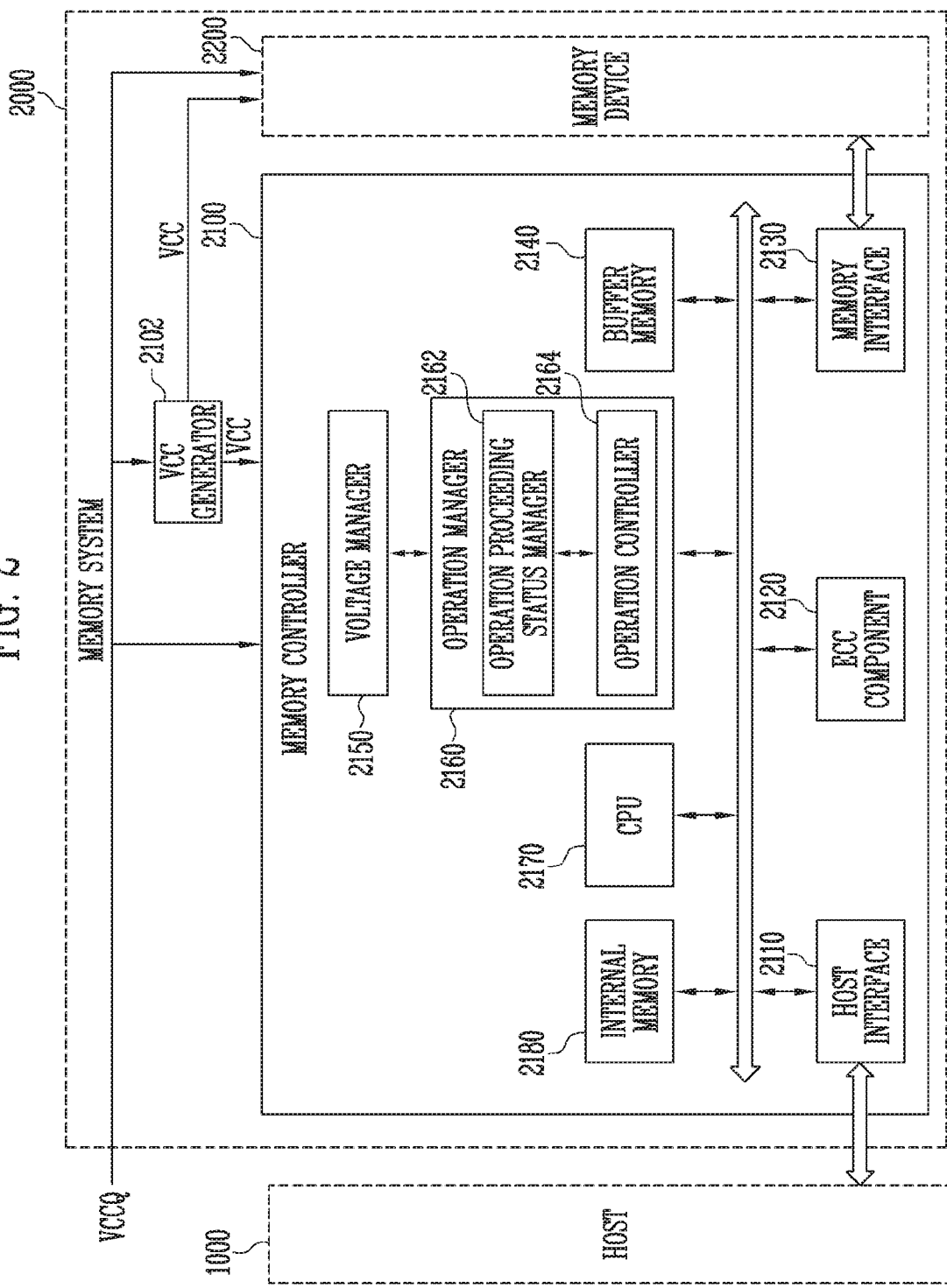
FIG. 2 is a diagram illustrating a memory controller shown in FIG. 1, in accordance with an embodiment of the present disclosure.

FIG. 2 is a diagram illustrating the memory controller 2100 shown in FIG. 1, in accordance with an embodiment of the present disclosure.

Referring to FIG. 2, the memory controller 2100 may include a host interface 2110, an error correction code (ECC) component 2120, a memory interface 2130, a buffer memory 2140, a voltage manager 2150, an operation manager 2160, a central processing unit (CPU) 2170, and an internal memory 2180. The host interface 2110, the ECC component 2120, the memory interface 2130, the buffer memory 2140, and the voltage manager 2150, the operation manager 2160, and the internal memory 2180 may be controlled by the CPU 2170.

The host interface 2110 may perform data exchange with the host 1000 using a communication protocol.

The ECC component 2120 may detect an error during a program operation or a read operation, and correct the detected error.

The memory interface 2130 may communicate with the memory device 2200 using a communication protocol. The memory interface 2130 may receive an external voltage VCCQ and communicate with the memory device 2200 using the external voltage VCCQ.

The buffer memory 2140 may temporarily store data while the memory controller 2100 controls the memory device 2200. For example, data received from the host may be temporarily stored in the buffer memory 2140 until the program operation is completed. Furthermore, data read from the memory device 2200 during a read operation may be temporarily stored in the buffer memory 2140. In an embodiment, the buffer memory 2140 may be provided outside the memory controller 2100.

The voltage manager 2150 may monitor an external voltage VCCQ and an internal voltage VCC to be supplied to the memory device 2200. The internal voltage VCC may be a voltage generated from the external voltage VCCQ by the VCC generator 2102. When voltage abnormality occurs in any one of the external voltage VCCQ and the internal voltage VCC, the voltage manager 2150 may notify the operation manager 2160 that voltage abnormality has occurred. For example, if the voltage level of at least one of the external voltage VCCQ and the internal voltage VCC drops below the normal range or exceeds the normal range, the voltage manager 2150 may notify the operation manager 2160 of this voltage abnormality. After the voltage abnormality has occurred in the external voltage VCCQ or the internal voltage VCC, the voltage manager 2150 may determine whether the abnormal voltage has been recovered back into the normal range. If the abnormal voltage has been recovered into the normal range, the voltage manager 2150 may notify the operation manager 2160 that the voltage abnormality has been recovered.

The operation manager 2160 may include an operation proceeding status manager 2162 and an operation controller 2164.

The operation proceeding status manager 2162 may monitor the operation controller 2164 and manage operation proceeding status information. For example, with regard to each command stored in the operation controller 2164, the operation proceeding status manager 2162 may manage information about whether the command is being transmitted to the memory device 2200 or has been transmitted thereto, whether an address corresponding to the command is being transmitted to the memory device 2200 or has been transmitted thereto, or whether data corresponding to the command and address is being transmitted to the memory device 2200 or has been transmitted thereto.

The operation controller 2164 may store a command and an address received from the CPU 2170. For example, the operation controller 2164 may store a plurality of commands received from the CPU 2170 and addresses corresponding to the respective commands.

The operation controller 2164 may perform operation control of the memory device 2200. In other words, the operation controller 2164 may transmit a command, an address, and data to the memory device 2200. Until an operation corresponding to a command is completed, the operation controller 2164 may store the command and the address corresponding to the command.

When the operation controller 2164 is notified from the voltage manager 2150 that the voltage abnormality has occurred, the operation controller 2164 may check the type of the operation control, which is being performed for the operation of the memory device 2200 at the time of the occurrence of the voltage abnormality. The checking of the kind of the operation control may be performed by referring to the operation proceeding status information that is managed by the operation proceeding status manager 2162.

The operation controller 2164 may re-perform the operation control being performed on the memory device 2200 at the time of the occurrence of the voltage abnormality. The operation control may be re-performed when the operation controller 2164 is notified from the voltage manager 2150 that the voltage abnormality has been removed, or after the preset time passes after it is notified from the voltage manager 2150 that the voltage abnormality has occurred.

If the operation controller 2164 is notified from the voltage manager 2150 that voltage abnormality has occurred in the external voltage VCCQ while a command is being transmitted from the memory controller 2100 to the memory device 2200, the operation controller 2164 may re-transmit the command to the memory device 2200. If the voltage abnormality occurs while the command is being transmitted, the memory device 2000 may not normally receive the command or may receive the command containing an error. Thus, the memory device 2000 may not normally perform the operation corresponding to the command, and may normally perform the operation according to the command to be re-transmitted from the operation controller 2164.

For example, if it is assumed that the operation proceeding status information indicates that a command CMD 1 for a program operation is being transmitted at a point in time when voltage abnormality occurs in the external voltage VCCQ, the operation controller 2164 may re-transmit the command CMD 1 to the memory device 2200 and transmit an address ADD 1 and data DATA 1 corresponding to the command CMD 1 to the memory device 2200. The address ADD 1 corresponding to the command CMD 1 may be stored in the operation proceeding status manager 2162, and the data DATA 1 may be stored in the buffer memory 2140.

For example, if it is assumed that the operation proceeding status information indicates that a command CMD 2 for a data sensing operation is being transmitted at a point in time when voltage abnormality occurs in the external voltage VCCQ, the operation controller 2164 may re-transmit the command CMD 2 to the memory device 2200 and transmit an address ADD 2 corresponding to the command CMD 2 to the memory device 2200. The address ADD2 corresponding to the command CMD 2 may be stored in the operation proceeding status manager 2162.

If the operation controller 2164 is notified from the voltage manager 2150 that voltage abnormality has occurred in the external voltage VCCQ while an address is being transmitted to the memory device 2200 after a command required for performing operation control of the memory device 2200 is transmitted to the memory device 2200, the operation controller 2164 may re-transmit the command and the address to the memory device 2200. If the voltage abnormality occurs while the address is being transmitted, the memory device 2000 may not normally receive the address or may receive the address containing an error. Thus, the memory device 2000 may not normally perform the operation corresponding to the command and the address, and may normally perform the operation according to the command and the address to be re-transmitted from the operation controller 2164.

For example, if it is assumed that, at a point in time when voltage abnormality occurs in the external voltage VCCQ, the operation proceeding status information indicates that a command CMD1 for a program operation has been transmitted and an address ADD 1 corresponding to the command CMD 1 is being transmitted, the operation controller 2164 may re-transmit the command CMD 1 and the address ADD 1 to the memory device 2200 and transmit data DATA 1 corresponding to the command CMD 1 and the address ADD 1 to the memory device 2200.

For example, if it is assumed that, at a point in time when voltage abnormality occurs in the external voltage VCCQ, the operation proceeding status information indicates that a command CMD 2 for a data sensing operation has been transmitted and an address ADD 2 corresponding to the command CMD 2 is being transmitted, the operation controller 2164 may re-transmit the command CMD 2 and the address ADD 2 to the memory device 2200.

If the operation controller 2164 is notified from the voltage manager 2150 that voltage abnormality has occurred in the external voltage VCCQ, while data is being transmitted to the memory device 2200 after a command and an address required for performing operation control of the memory device 2200 are transmitted to the memory device 2200, the operation controller 2164 may re-transmit the command, the address, and the data to the memory device 2200. If the voltage abnormality occurs while the data is being transmitted, the memory device 2000 may not normally receive the data. Thus, the memory device 2000 may not normally perform the operation corresponding to the command, the address and the data, and may normally perform the operation according to the command, the address and the data to be re-transmitted from the operation controller 2164.

For example, if it is assumed that, at a point in time when voltage abnormality occurs in the external voltage VCCQ, the operation proceeding status information indicates that a command CMD 1 for a program operation and an address ADD1 have been transmitted and data DATA 1 corresponding to the command CMD 1 and the address ADD 1 is being transmitted, the operation controller 2164 may re-transmit the command CMD 1, the address ADD 1, and the data DATA 1 to the memory device 2200.

If, after having transmitted at least one of a command, an address, and data required for performing operation control of the memory device 2200 to the memory device 2200, the operation controller 2164 is notified from the voltage manager 2150 that voltage abnormality has occurred in the external voltage VCCQ or the internal voltage VCC, the operation controller 2164 may re-perform the operation control of the memory device 2200, further taking into account a result of checking the status of the memory device 2200 at the point in time when the voltage abnormality occurs.

If the result of checking the status of the memory device 2200 at the point in time when the voltage abnormality occurs in the external voltage VCCQ or the internal voltage VCC indicates that the memory device 2200 is performing an operation corresponding to the command transmitted to the memory device 2200, at least one of the command, the address, and the data may be re-transmitted to the memory device 2200.

If the result of checking the status of the memory device 2200 at the point in time when the voltage abnormality occurs in the external voltage VCCQ or the internal voltage VCC indicates that the memory device 2200 is not performing the operation corresponding to the command transmitted to the memory device 2200, the command, the address, and the data may not be re-transmitted to the memory device 2200.

For example, if it is assumed that, at a point in time when voltage abnormality occurs in the internal voltage VCC, the operation proceeding status information indicates that a command CMD 2 and an address ADD 2 for a data sensing operation have been transmitted, the operation controller 2164 may determine whether to re-transmit the command CMD 2 and the address ADD 2 to the memory device 2200.

For instance, if the operation proceeding status information indicates that the command CMD 2 for a data sensing operation and the address ADD 2 corresponding to the command CMD 2 have been transmitted, the operation controller 2164 may request the CPU 2170 to perform an operation of checking the status of the memory device 2200. Thereby, the CPU 2170 may transmit a status check command to the memory device 2200 and receive a status check result in response thereto. The CPU 2170 may transmit the received status check result to the operation controller 2164.

If the status check result indicates a busy status, this may correspond to the case where voltage abnormality has occurred while the memory device 2200 senses data. In this case, the operation controller 2164 may re-transmit the command CMD 2 and the address ADD 2 to the memory device 2200 such that the data sensing operation is re-performed. If the voltage abnormality occurs while the memory device 2200 senses the data, the data sensing operation of the memory device 2200 may not be normally performed, or sensed-data corresponding to the data sensing operation may contain error. Thus, the memory device may re-perform the data sensing operation according to the command CMD 2 and the address ADD 2 to be re-transmitted from the operation controller 2164.

If the status check result indicates a ready status, this may correspond to the case where voltage abnormality has occurred after the memory device 2200 has completed the data sensing operation. In this case, the operation controller 2164 may transmit a command for a sensed-data output operation to the memory device 2200 rather than re-transmitting the command CMD 2 and the address ADD 2 to the memory device 2200.

For example, if it is assumed that, at a point in time when voltage abnormality occurs in the external voltage VCCQ, the operation proceeding status information indicates that a command CMD 3 for a sensed-data output operation is being transmitted, the operation controller 2164 may re-transmit the command CMD 3 to the memory device 2200.

For example, if it is assumed that, at a point in time when voltage abnormality occurs in the external voltage VCCQ, the operation proceeding status information indicates that a command CMD 3 for a sensed-data output operation has been transmitted, the operation controller 2164 may determine whether to re-transmit the command CMD 3 to the memory device 2200. For instance, if the operation proceeding status information indicates that the command CMD 3 for a sensed-data output operation has been transmitted, the operation controller 2164 may request the CPU 2170 to perform an operation of checking the status of the memory device 2200. Thereby, the CPU 2170 may transmit a status check command to the memory device 2200 and receive a status check result in response thereto. The CPU 2170 may transmit the received status check result to the operation controller 2164. If the status check result indicates a busy status, this may correspond to the case where voltage abnormality has occurred while the memory device 2200 outputs sensed-data. If the voltage abnormality occurs while the memory device 2200 outputs the sensed-data, an error may occur in the sensed-data and the memory controller 2100 may receive sensed-data containing the error. In this case, the operation controller 2164 may re-transmit the command CMD 3 to the memory device 2200 such that the sensed-data output operation is re-performed. If the status check result indicates a ready status, this may correspond to the case where voltage abnormality has occurred after the memory device 2200 has completed the sensed-data output operation. In this case, the operation controller 2164 may not re-transmit the command CMD 3 to the memory device 2200.

The CPU 2170 may perform various operations or generate a command and an address so as to control the operation of the memory device 2200. For example, the CPU 2170 may generate various commands needed for a program operation, a read operation, an erase operation, a suspend operation, and a copy-back operation. The CPU 2170 may transmit the generated command and address to the operation manager 2160. The CPU 2170 may transmit a status check command to the memory device 2200 in response to a request of the operation controller 2164, and may transmit, to the operation controller 2164, a status check result received from the memory device 2200.

The internal memory 2180 may be used as a storage unit for storing various information needed for the operation of the memory controller 2100. The internal memory 2170 may include a map table (not shown). For example, physical-to-logical (P2L) address information and logical-to-physical (L2P) address information may be stored in the map table.

Figure 3:
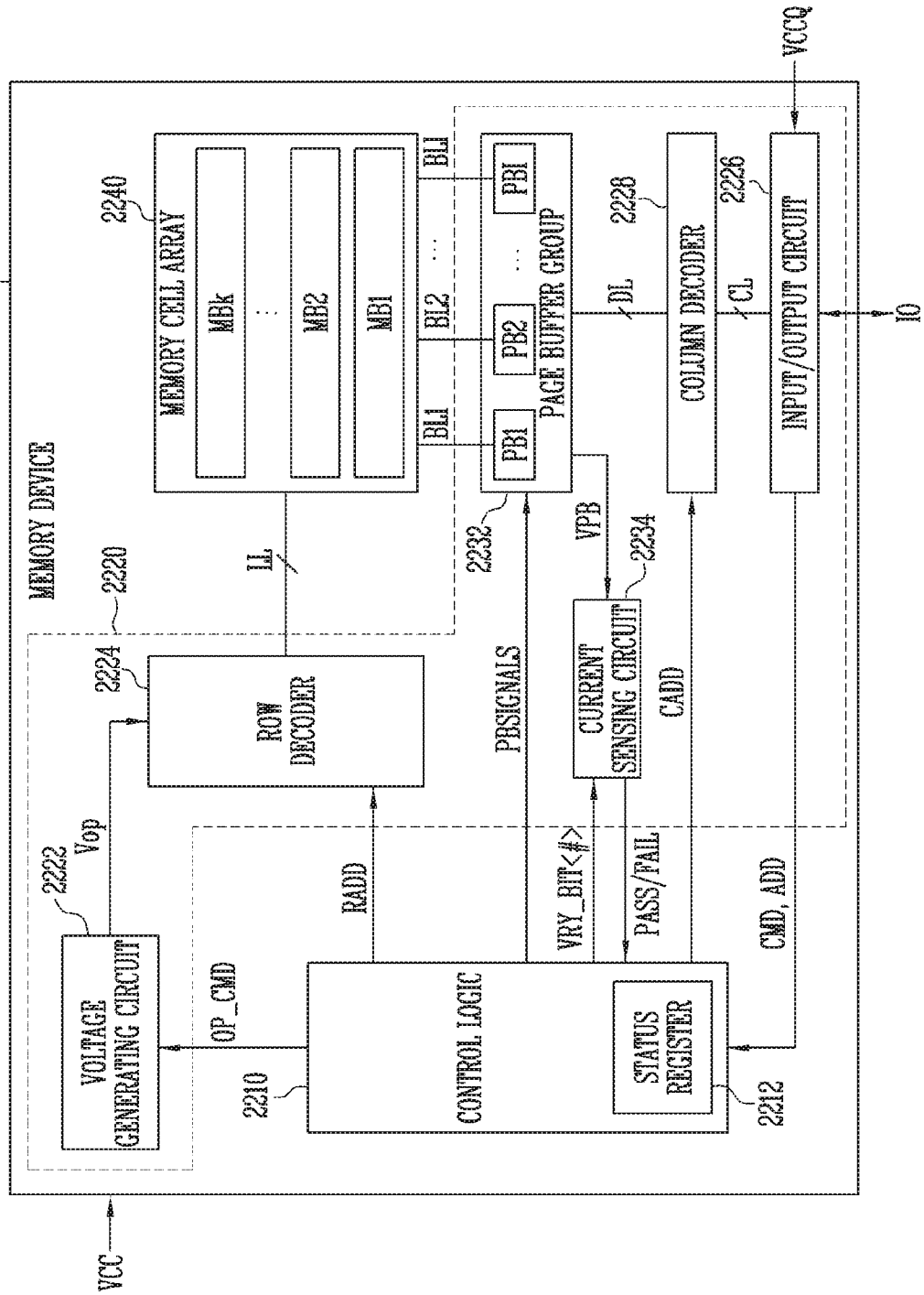
FIG. 3 is a diagram illustrating a memory device shown in FIGS. 1 and 2, in accordance with an embodiment of the present disclosure.

FIG. 3 is a diagram illustrating the memory device 2200 shown in FIGS. 1 and 2, in accordance with an embodiment of the present disclosure.

The memory device 2200 may include a control logic 2210, peripheral circuits 2220, and a memory cell array 2240, all of which operate using an internal voltage VCC supplied to the memory device 2200. The peripheral circuits 2220 may include a voltage generating circuit 2222, a row decoder 2224, an input/output circuit 2226, a column decoder 2228, a page buffer group 2232, and a current sensing circuit 2234. The input/output circuit 2226 may operate using an external voltage VCCQ supplied thereto. In other words, the external voltage VCCQ may be used to transmit and receive at least one of a command, an address, and data between the memory controller 2100 and the memory device 2200. The internal voltage VCC may be used for an operation of the memory device 2200 in response to a command and an address which are received from the memory controller 2100.

The control logic 2210 may control the peripheral circuits 2220 under control of the memory controller 2100 shown in FIG. 2. The control logic 2210 may control the peripheral circuits 2220 in response to a command CMD and an address ADD which are received from the memory controller 2100 through the input/output circuit 2226. For example, the control logic 2210 may output an operating signal OP_CMD, a row address RADD, page buffer control signals PBSIGNALS, and an allowable bit VRY_BIT<#> in response to the command CMD and the address ADD. The control logic 2210 may determine whether a verify operation has passed or failed, in response to a pass signal PASS or a fail signal FAIL received from the current sensing circuit 2234.

The command CMD received from the memory controller 2100 may include an operation command and a status check command. The operation command may include a program operation command, an erase operation command, a read operation command, a suspend operation command, and a copy-back operation command.

The control logic 2210 may record the status of the memory device 2200 to a status register 2212 while performing an operation in response to a command received from the memory controller 2100. For example, if the command received from the memory controller 2100 is a program operation command, information about whether an operation corresponding to the program operation command has been successfully performed or has failed may be recorded to the status register 2212.

When a status check command is received from the memory controller 2100, the control logic 2210 may transmit status check bits stored in the status register 2212 to the memory controller 2100.

The peripheral circuits 2220 may perform, under control of the control logic 2210, a program operation for storing data to the memory cell array 2240, a read operation for outputting a data stored in the memory cell array 2240, or an erase operation for erasing data stored in the memory cell array 2240. Furthermore, the peripheral circuits 2220 may perform a suspend operation of suspending an operation which is currently performed, or a copy-back operation of copying data to other memory blocks.

The voltage generating circuit 2222 may generate various operating voltages Vop to be used for the program operation, the read operation, or the erase operation in response to an operating signal OP_CMD received from the control logic 2210. For example, the voltage generating circuit 2222 may generate a program voltage, a verify voltage, a pass voltage, a compensation program voltage, a read voltage, an erase voltage, a turn-on voltage, etc.

The row decoder 2224 may transmit, in response to a row address RADD received from the control logic 2210, operating voltages Vop to local lines LL coupled to a selected one of the memory blocks included in the memory cell array 2240. The local lines LL may include local word lines, local drain select lines, and local source select lines. In addition, the local lines LL may include various lines such as source lines coupled to the memory blocks.

The input/output circuit 2226 may transmit, to the control logic 2210, a command CMD and an address ADD received from the memory controller through input/output lines DQ, or may exchange data with the column decoder 2228. The input/output circuit 2226 may receive an internal voltage VCC or an external voltage VCCQ and transmit or receive a command, an address and data using the internal voltage VCC or the external voltage VCCQ. The following description for embodiments will be made for an example where the input/output circuit 2226 operates using the external voltage VCCQ supplied thereto.

The column decoder 2228 may transmit data between the input/output circuit 2226 and the page buffer group 2232 in response to a column address CADD received from the control logic 2210. For example, the column decoder 2228 may exchange data with page buffers PB1 to PBI through data lines DL or exchange data with the input/output circuit 2226 through column lines CL.

The page buffer group 2232 may be coupled to bit lines BL1 to BLI coupled in common to the memory blocks included in the memory cell array 2240. The page buffer group 2232 may include the plurality of page buffers PB1 to PBI coupled to the bit lines BL1 to BLI. For example, a single page buffer may be coupled to each bit line. The page buffers PB1 to PBI may operate in response to page buffer control signals PBSIGNALS received from the control logic 2210. For example, during a program operation, the page buffers PB1 to PBI may temporarily store program data received from the memory controller, and adjust voltages to be applied to the bit lines BL1 to BLI according to the program data. Furthermore, during a read operation, the page buffers PB1 to PBI may temporarily store data received through the bit lines BL1 to BLI or sense voltages or current of the bit lines BL1 to BLI.

During a read operation or a verify operation, the current sensing circuit 2234 may generate a reference current in response to an allowable bit VRY_BIT<#> received from the control logic 2210, and may compare a sensing voltage VPB received from the page buffer group 2232 with a reference voltage generated by the reference current and output a pass signal PASS or a fail signal FAIL.

The memory cell array 2240 may include a plurality of memory blocks MB1 to MBk configured to store data. User data and various information needed for operations of the memory device 2200 may be stored in the memory blocks MB1 to MBk. The memory blocks MB1 to MBk may be embodied in a two-dimensional structure or a three-dimensional structure, and have the same configuration.

Figure 4:
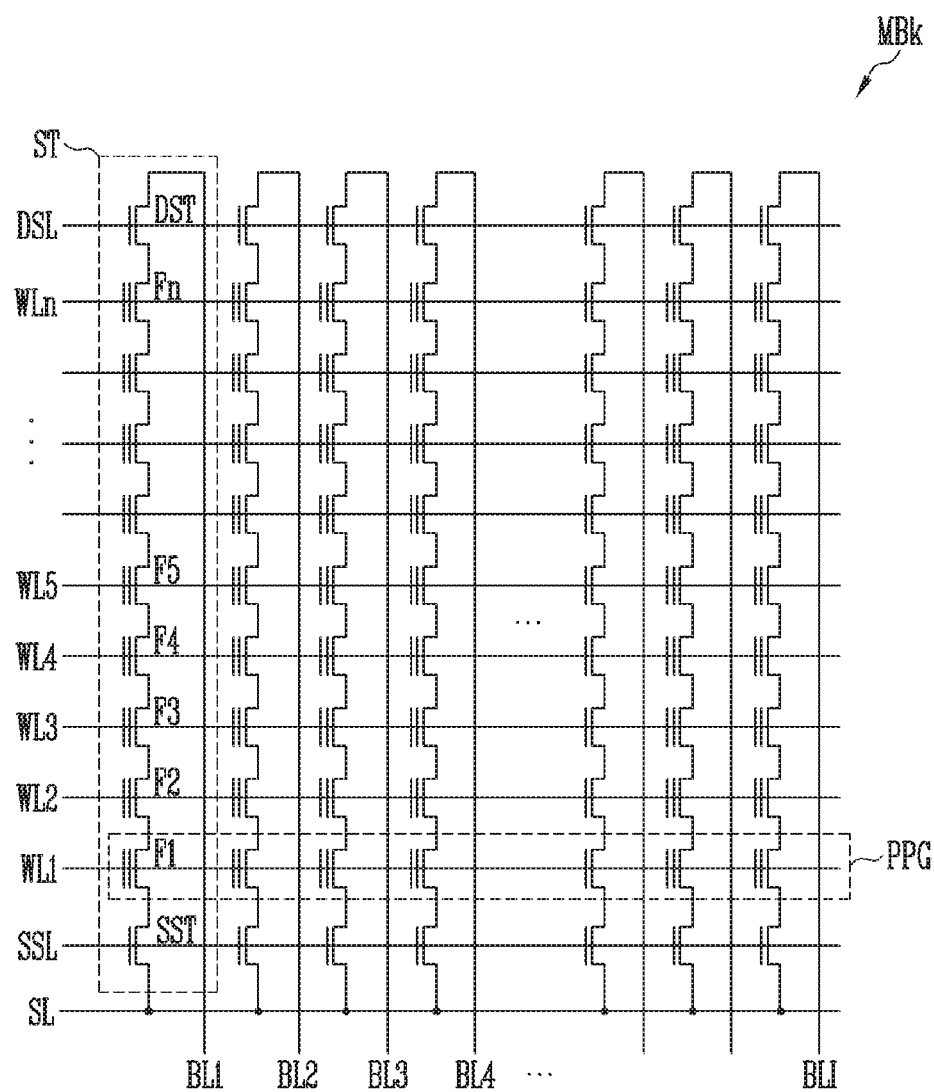
FIG. 4 is a diagram illustrating a memory block having a two-dimensional structure in accordance with an embodiment of the present disclosure.

FIG. 4 is a diagram illustrating a memory block MBk having a two-dimensional structure in accordance with an embodiment of the present disclosure.

As illustrated in FIG. 3, the memory cell array (e.g., the memory cell array 2240) may include a plurality of memory blocks MB1 to MBk. The memory block MBk of FIG. 4 may correspond to any one among the plurality of memory blocks MB1 to MBk of FIG. 3.

The memory block MBk may include a plurality of cell strings ST coupled between the bit lines BL1 to BLI and the source line SL. The cell strings ST may be coupled to the respective bit lines BL1 to BLi and coupled in common to the source line SL. The cell strings ST have almost the same structure; therefore, a cell string ST coupled to the first bit line BL1 will be described by way of example.

The cell string ST may include a source select transistor SST, first to n-th memory cells F1 to Fn (n is a positive integer), and a drain select transistor DST, which are coupled in series to each other between the source line SL and the first bit line BL1. The numbers of source and drain select transistors SST and DST are not limited to those shown in FIG. 4.

The source select transistor SST may be coupled between the source line SL and a first memory cell F1. The first to n-th memory cells F1 to Fn may be coupled in series between the source select transistor SST and the drain select transistor DST. The drain select transistor DST may be coupled between the n-th memory cell Fn and the first bit line BL1. Although not shown, dummy cells may be further coupled between the memory cells F1 to Fn or between the source select transistor SST and the drain select transistor DST.

Gates of the source select transistors SST included in the cell string ST may be coupled to a source select line SSL. Gates of the first to n-th memory cells F1 to Fn may be respectively coupled to first to n-th word lines WL1 to WLn. Gates of the drain select transistors DST may be coupled to a drain select line DSL. A group of memory cells coupled to each of the word lines WL1 to WLn may be referred to as a physical page PPG. For example, among the memory cells F1 to Fn included in different cell strings ST, a group of first memory cells F1 coupled to the first word lines WL1 may form a single physical page PPG. In the case where a multi-level cell (MLC) structure is used, a plurality of logical pages may be included in a single physical page PPG.

Figure 5:
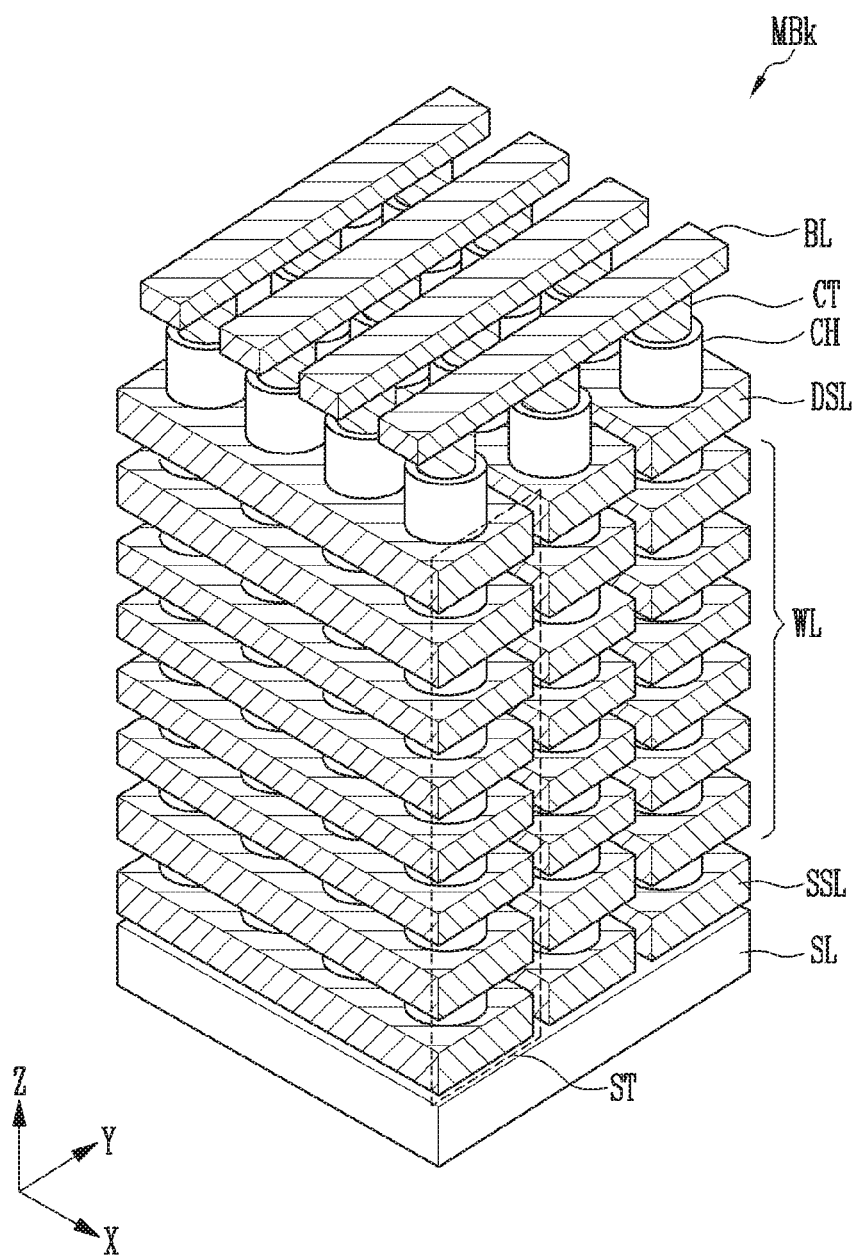
FIG. 5 is a diagram illustrating a memory block having a three-dimensional structure in accordance with an embodiment of the present disclosure.

FIG. 5 is a diagram illustrating a memory block MBk having a three-dimensional structure in accordance with an embodiment of the present disclosure.

As illustrated in FIG. 3, the memory cell array (e.g., the memory cell array 2240) may include a plurality of memory blocks MB1 to MBk. The memory block MBk of FIG. 5 may correspond to any one among the plurality of memory blocks MB1 to MBk of FIG. 3.

Referring to FIG. 5, the memory block MBk having a three-dimensional structure may be formed on a substrate in an "I" shape in a direction (Z-axis direction) perpendicular to the substrate. The memory block MBk may include a plurality of cell strings ST arranged between bit lines BL and a source line SL. In an embodiment, a well may be formed in lieu of the source line SL. This structure may be referred to as a bit cost scalable (BiCS) structure. For example, in the case where the source line SL is formed over the substrate in a direction parallel to the substrate, the cell strings ST having a BiCS structure may be formed over the source line SL in the direction (Z-axis direction) perpendicular to the substrate.

In detail, the cell strings ST may be arranged in a first direction (X-axis direction) and a second direction (Y-axis direction). The cell strings ST may include source select liens SSL, word lines WL, and drain select lines DSL which are stacked at positions spaced apart from each other. The numbers of source select lines SSL, word lines WL, and drain select lines DSL are not limited to those shown in the drawing, and may be changed in some embodiments. The cell strings ST may include vertical channel layers CH and bit lines BL. The vertical channel layers CH may vertically pass through the source select lines SSL, the word lines WL, and the drain select lines DSL. The bit lines BL may come into contact with upper ends of the vertical channel layers CH that protrude upward from the drain select lines DSL, and may extend in the second direction (Y-axis direction). The memory cells may be formed between the word lines WL and the vertical channel layers CH. Contact plugs CT may be further formed between the bit lines BL and the vertical channel layers CH.

Figure 6:
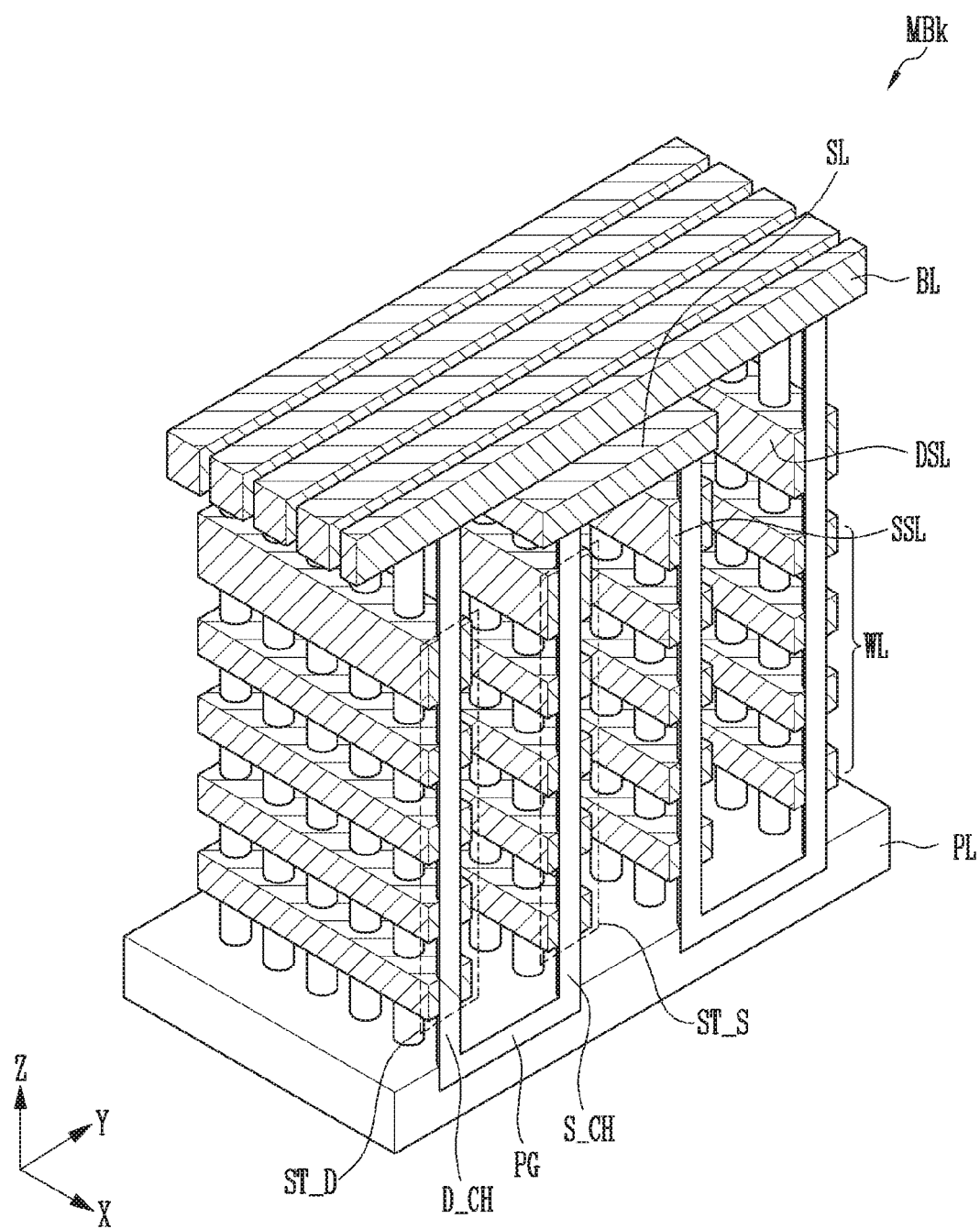
FIG. 6 is a diagram illustrating a memory block having a three-dimensional structure in accordance with an embodiment of the present disclosure.

FIG. 6 is a diagram illustrating a memory block MBk having a three-dimensional structure in accordance with an embodiment of the present disclosure.

As illustrated in FIG. 3, the memory cell array (e.g., the memory cell array 2240) may include a plurality of memory blocks MB1 to MBk. The memory block MBk of FIG. 6 may correspond to any one among the plurality of memory blocks MB1 to MBk of FIG. 3.

Referring to FIG. 6, the memory block MBk having a three-dimensional structure may be formed on a substrate in a "U" shape in a direction (Z-axis direction) perpendicular to the substrate. The memory block MBk may include source strings ST_S and drain strings ST_D which are coupled between bit lines BL and a source line SL and make pairs. Each source string ST_S and the corresponding drain string ST_D may be coupled to each other through a pipe gate PG to form a U shape. The pipe gate PG may be formed in a pipe line PL. In detail, the source strings ST_S may be formed between the source line SL and the pipe line PL in the direction perpendicular to the substrate. The drain strings ST_D may be formed between the bit lines BL and the pipe line PL in the direction perpendicular to the substrate. This structure may be referred to as a pipe-shaped bit cost scalable (P-BiCS) structure.

In detail, the drain strings ST_D and the source strings ST_S may be arranged in a first direction (X-axis direction) and a second direction (Y-axis direction). The drain strings ST_D and the source strings ST_S may be alternately arranged in the second direction (Y-axis direction). Each of the drain strings ST_D may include word lines WL and a drain select line DSL which are stacked at positions spaced apart from each other. The drain string ST_D may include vertical drain channel layers D_CH which perpendicularly pass through the word lines WL and the drain select line DSL. Each of the source strings ST_S may include word lines WL and a source select line SSL which are stacked at positions spaced apart from each other. The source string ST_S may include vertical source channel layers S_CH which perpendicularly pass through the word lines WL and the source select line SSL. The vertical drain channel layers D_CH and the vertical source channel layers S_CH may be coupled to each other by the pipe gates PG in the pipe line PL. The bit lines BL may come into contact with upper ends of the vertical drain channel layers D_CH that protrude upward from the drain select line DSL, and may extend in the second direction (Y-axis direction).

Figures 7, 8:
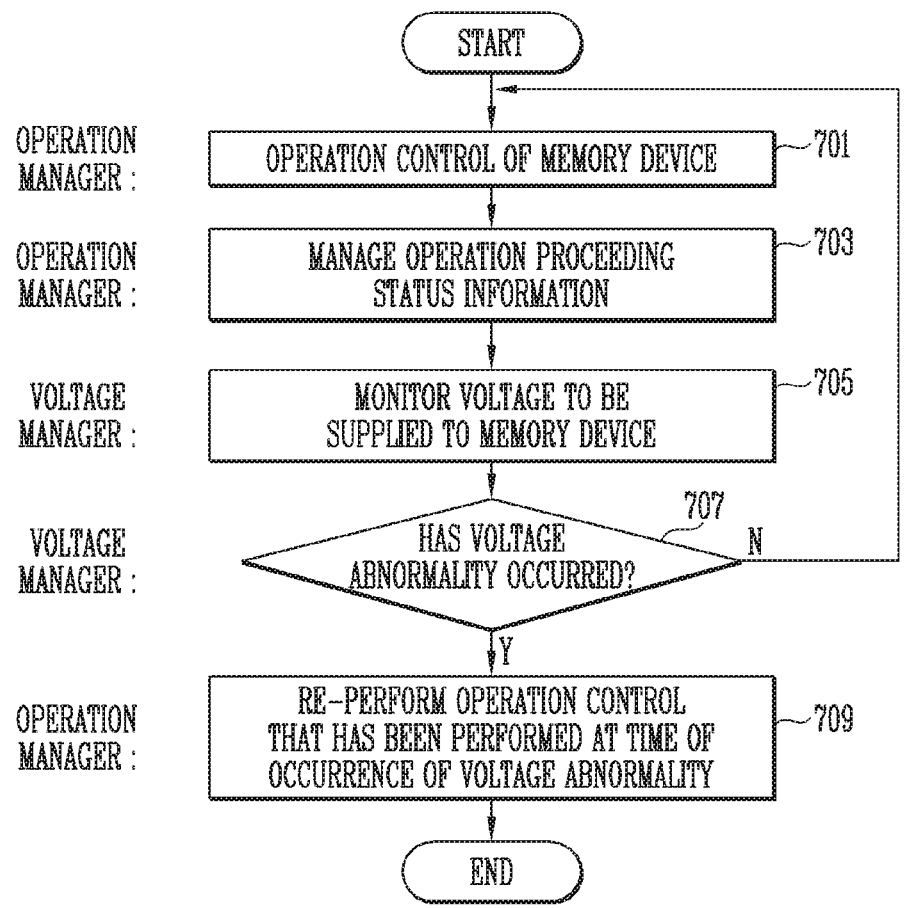
FIG. 7 is a flowchart describing a method of operating a memory controller in accordance with an embodiment of the present disclosure.
FIG. 8 is a diagram illustrating operation proceeding status information in accordance with an embodiment of the present disclosure.

FIG. 7 is a flowchart describing a method of operating the memory controller 2100 in accordance with an embodiment of the present disclosure. In describing the embodiment, references will be made to FIGS. 1 to 6.

An embodiment to be described with reference to FIG. 7 may be applied to the memory system 2000 described with reference to FIGS. 1 to 6. In some embodiments, at least one of steps shown in FIG. 7 may be omitted. In some embodiments, the sequence of steps shown in FIG. 7 may be changed.

At step 701, the operation manager 2160 may perform operation control of the memory device 2200. For example, the operation manager 2160 may transmit, to the memory device 2200, at least one of a command, an address and data required for an operation of the memory device 2200.

At step 703, the operation manager 2160 may manage the operation proceeding status information of the memory device 2200. For example, the operation manager 2160 may manage information indicating which one of the command, the address and the data for the operation of the memory device 2200 is being transmitted or has been transmitted.

At step 705, the voltage manager 2150 may monitor a voltage to be supplied to the memory device 2200. The voltage to be supplied to the memory device 2200 may include at least one of an external voltage VCCQ and an internal voltage VCC.

At step 707, the voltage manager 2150 may determine whether voltage abnormality has occurred, as a result of monitoring the voltage to be supplied to the memory device 2200. If voltage abnormality has occurred (that is, "Y" at step 707), the voltage manager 2150 may notify the operation manager 2160 that the voltage abnormality has occurred. Thereafter, the voltage manager 2150 may consistently monitor the voltage to be supplied to the memory device 2200. If the voltage abnormality has been removed, the voltage manager 2150 may notify the operation manager 2160 that the voltage abnormality has been removed. If the voltage abnormality has not occurred (that is, "N" at step 707), steps 701 to 705 are repeated.

At step 709, the operation manager 2160 may re-perform the operation control being performed on the memory device 2200 at the time of the occurrence of the voltage abnormality. This operation control may be performed after a preset time passes from the time of the occurrence of the voltage abnormality, or may be performed when the operation controller 2164 is notified from the voltage manager 2150 that the voltage abnormality has been removed.

FIG. 8 is a diagram illustrating the operation proceeding status information in accordance with an embodiment of the present disclosure. In describing the embodiment, references will be made to FIGS. 1 to 6.

Referring to FIG. 8, the operation proceeding status information, managed by the operation proceeding status manager 2162 of the operation manager 2160, may indicate whether a command, an address, and data are being transmitted to the memory device 2200 or have been transmitted thereto. The operation proceeding status information may be stored in an internal memory or in the operation proceeding status manager 2162 (shown in FIG. 2) within the memory controller 2100.

FIG. 8 illustrates an example where a command CMD 1 for a program operation has been transmitted, an address ADD 1 corresponding to the command CMD 1 is being transmitted, and data DATA 1 corresponding to the command CMD 1 and the address ADD 1 has not yet been transmitted.

Furthermore, FIG. 8 illustrates that a command CMD 2 for a data sensing operation and an address ADD 2 corresponding to the command CMD 2 have not yet been transmitted.

Furthermore, FIG. 8 illustrates that a command CMD 3 for a sensed-data output operation has not yet been transmitted.

The operation proceeding status information, managed by the operation proceeding status information manager 2162 of the operation manager 2160, may be updated each time at least one of a command, an address, and data is transmitted to the memory device 2200. The operation proceeding status information may be stored in an internal memory or in the operation proceeding status manager 2162 (shown in FIG. 2) within the memory controller 2100.

Figure 9A:
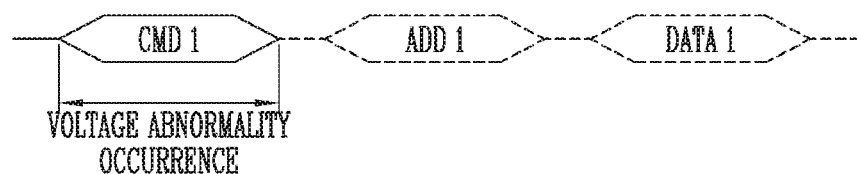
FIGS. 9A and 9B are diagrams illustrating an example where voltage abnormality has occurred during an operation control for a program operation.
Figure 9B:
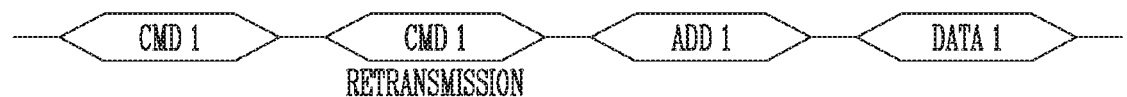

FIGS. 9A and 9B are diagrams illustrating the case where voltage abnormality occurs during an operation control for a program operation. In describing the embodiment, references will be made to FIGS. 1 to 6.

Referring to FIG. 9A, it is assumed that the voltage abnormality occurs in the external voltage VCCQ while the memory controller 2100 is transmitting the command CMD 1 for a program operation to the memory device 2200. As such, if the voltage abnormality occurs while the command CMD 1 is being transmitted, the command CMD 1 may not be correctly transmitted, or may be changed.

In this case, as shown in FIG. 9B, the memory controller 2100 may re-transmit the command CMD 1 to the memory device 2200, and sequentially transmit the address ADD 1 and the data DATA 1 corresponding to the command CMD 1 to the memory device 2200.

Figure 10A:
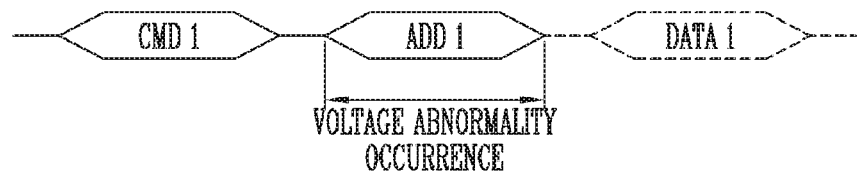
FIGS. 10A and 10B are diagrams illustrating an example where voltage abnormality has occurred during an operation control for a program operation.
Figure 10B:
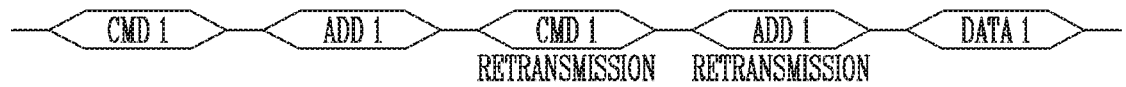

FIGS. 10A and 10B are diagrams illustrating an example where voltage abnormality occurs during an operation control for a program operation. In describing the embodiment, references will be made to FIGS. 1 to 6.

Referring to FIG. 10A, it is assumed that voltage abnormality occurs in the external voltage VCCQ while, after having transmitted the command CMD 1 for the program operation to the memory device 2200, the memory controller 2100 is transmitting the address ADD 1 corresponding to the command CMD 1 to the memory device 2200. In this case, an error may occur in the address ADD 1.

Hence, as shown in FIG. 10B, the memory controller 2100 may re-transmit the command CMD 1 and the address ADD 1 to the memory device 2200, and transmit the data DATA 1 corresponding to the command CMD 1 and the address ADD 1 to the memory device 2200.

Figure 11A:
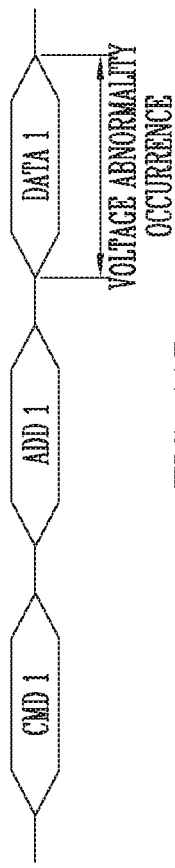
FIGS. 11A and 11B are diagrams illustrating an example where voltage abnormality has occurred during an operation control for a program operation.
Figure 11B:
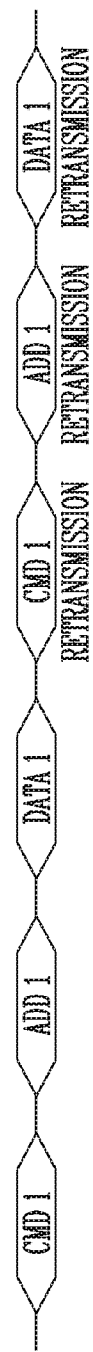

FIGS. 11A and 11B are diagrams illustrating an example where voltage abnormality occurs during an operation control for a program operation. In describing the embodiment, references will be made to FIGS. 1 to 6.

Referring to FIG. 11A, it is assumed that the voltage abnormality occurs in the external voltage VCCQ while, after having transmitted the command CMD 1 and the address ADD 1 for the program operation to the memory device 2200, the memory controller 2100 is transmitting the data DATA 1 corresponding to the command CMD 1 and the address ADD 1 to the memory device 2200. In this case, an error may occur in the data DATA 1.

Hence, as shown in FIG. 11B, the memory controller 2100 may re-transmit the command CMD 1, the address ADD 1, and the data DATA 1 to the memory device 2200.

Figure 12A:
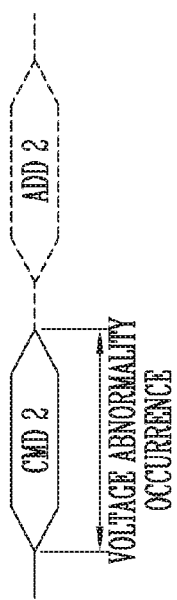
FIGS. 12A and 12B are diagrams illustrating an example where voltage abnormality has occurred during an operation control for a data sensing operation.
Figure 12B:
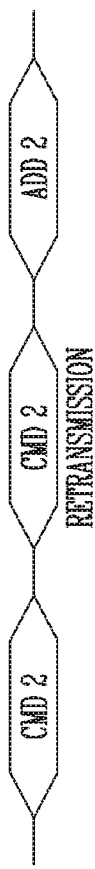

FIGS. 12A and 12B are diagrams illustrating an example where voltage abnormality occurs during an operation control for a data sensing operation. In describing the embodiment, references will be made to FIGS. 1 to 6.

Referring to FIG. 12A, it is assumed that the voltage abnormality occurs in the external voltage VCCQ while the memory controller 2100 is transmitting the command CMD 2 for a data sensing operation to the memory device 2200. In this case, the command CMD 2 may not be corrected, transmitted, or may be changed.

Hence, as shown in FIG. 12B, the memory controller 2100 may re-transmit the command CMD 2 to the memory device 2200, and transmit the address ADD 2 corresponding to the command CMD 2 to the memory device 2200.

Figure 13A:
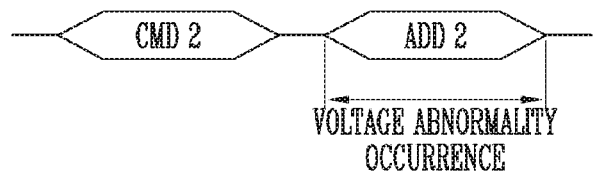
FIGS. 13A and 13B are diagrams illustrating an example where voltage abnormality has occurred during an operation control for a data sensing operation.
Figure 13B:
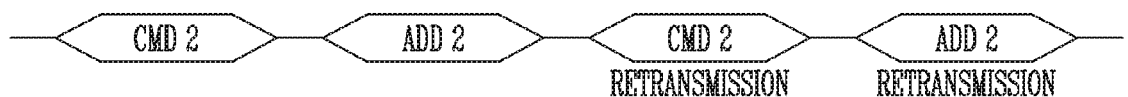

FIGS. 13A and 13B are diagrams illustrating an example where voltage abnormality occurs during an operation control for a data sensing operation. In describing the embodiment, references will be made to FIGS. 1 to 6.

Referring to FIG. 13A, it is assumed that the voltage abnormality occurs in the external voltage VCCQ while, after having transmitted the command CMD 2 for a data sensing operation to the memory device 2200, the memory controller 2100 is transmitting the address ADD 2 corresponding to the command CMD 2 to the memory device 2200. In this case, an error may occur in the address ADD 2.

Therefore, as shown in FIG. 13B, the memory controller 2100 may re-transmit the command CMD 2 and the address ADD 2 to the memory device 2200.

Figure 14A:
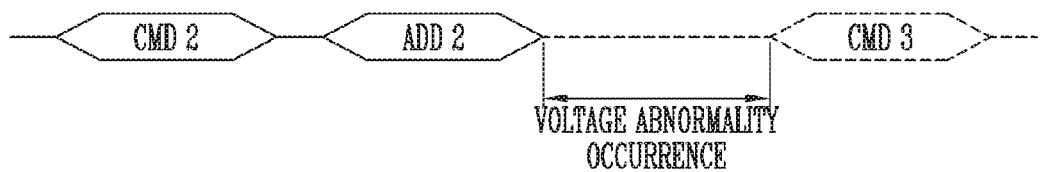
FIGS. 14A to 14C are diagrams illustrating an example where voltage abnormality has occurred during an operation control for a data sensing operation.
Figure 14B:
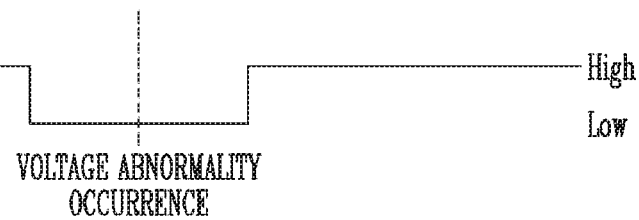
Figure 14C:
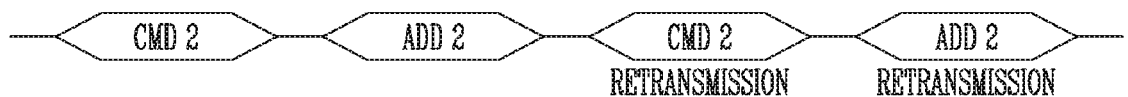

FIGS. 14A to 14C are diagrams illustrating an example where voltage abnormality occurs during an operation control for a data sensing operation. In describing the embodiment, references will be made to FIGS. 1 to 6.

Referring to FIG. 14A, it is assumed that the voltage abnormality occurs in the internal voltage VCC after having transmitted the command CMD 2 and the address ADD 2 for a data sensing operation to the memory device 2200 and before the memory controller 2100 transmits a command CMD 3 for a sensed-data output operation to the memory device 2200.

In this case, there is a need to distinguish between the case where the data sensing operation of the memory device 2200 is being to performed and the case where the data sensing operation has been completed. If the voltage abnormality occurs when the data sensing operation of the memory device 2200 is being performed, the memory device 2200 may be controlled such that the corresponding data sensing operation is re-performed. In the case where the data sensing operation of the memory device 2200 has been completed, there is no need to control the memory device 2200 such that the corresponding data sensing operation is re-performed.

To distinguish between these cases, if the voltage abnormality occurs, the memory controller 2100 may transmit a status check signal to the memory device 2200 and receive a status check result from the memory device 2200. If, as shown in FIG. 14B, the status check result received from the memory device 2200 indicates a busy (Low) status, it may be determined that the voltage abnormality has occurred while the data sensing operation is being performed. Therefore, as shown in FIG. 14C, the memory controller 2100 may re-transmit the command CMD 2 and the address ADD 2 to the memory device 2200. If the received status check result indicates a ready (High) status, it may be determined that the voltage abnormality has not occurred during the data sensing operation. Hence, the memory controller 2100 may not re-transmit the command CMD 2 and the address ADD 2 to the memory device 2200.

Figure 15A:
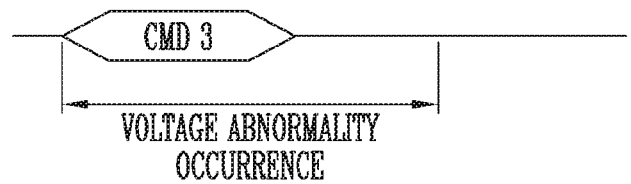
FIGS. 15A and 15B are diagrams illustrating an example where voltage abnormality has occurred during an operation control for a sensed-data output operation.
Figure 15B:
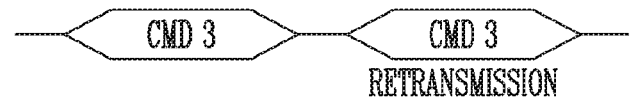

FIGS. 15A and 15B are diagrams illustrating an example where voltage abnormality occurs during an operation control for a sensed-data output operation. In describing the embodiment, references will be made to FIGS. 1 to 6.

Referring to FIG. 15A, it is assumed that the voltage abnormality occurs in the external voltage VCCQ while the memory controller 2100 is transmitting the command CMD 3 for a sensed-data output operation or after the memory controller 2100 has transmitted the command CMD 3 to the memory device 2200. In this case, an error may occur in the command CMD 3, or may occur in data transmitted from the memory device 2200.

If the voltage abnormality occurs in the external voltage VCCQ while the command CMD 3 is being transmitted, the memory controller 2100 may re-transmit the command CMD 3 to the memory device 2200, as shown in FIG. 15B.

In the case where the voltage abnormality occurs after the command CMD 3 is transmitted, there is a need to determine whether the sensed-data output operation is being performed. If the voltage abnormality occurs when the memory device 2200 is performing the sensed-data output operation, the memory device 2200 may be controlled such that the sensed-data output operation is re-performed. If not, there is no need to control the memory device 2200 to re-perform the sensed-data output operation.

To distinguish between these cases, if the voltage abnormality occurs, the memory controller 2100 may transmit a status check signal to the memory device 2200 and receive a status check result from the memory device 2200, in the same manner as that described with reference to FIG. 14B. If the status check result received from the memory device 2200 indicates a busy (Low) status, it may be determined that the voltage abnormality occurs while the sensed-data output operation is being performed. Therefore, as shown in FIG. 15B, the memory controller 2100 may re-transmit the command CMD 3 to the memory device 2200. If the received status check result indicates a ready (High) status, it may be determined that the voltage abnormality has not occurred while the sensed-data output operation is performed. Hence, the memory controller 2100 may not re-transmit the command CMD 3 to the memory device 2200.

Figure 16:
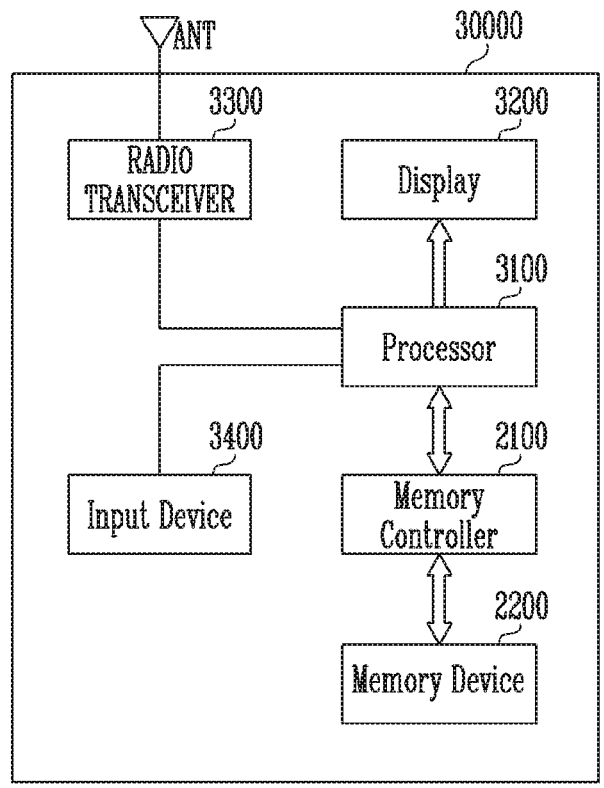
FIG. 16 is a diagram illustrating an example of a memory system including the memory controller shown in FIGS. 1 and 2.

FIG. 16 is a diagram illustrating an example of a memory system 30000 including the memory controller shown in FIGS. 1 and 2.

Referring to FIG. 16, the memory system 30000 may be embodied in a cellular phone, a smartphone, a tablet personal computer (PC), a personal digital assistant (PDA) or a wireless communication device. The memory system 30000 may include a memory device 2200 and a memory controller 2100 configured to control the operation of the memory device 2200.

The memory controller 2100 may control a data access operation, e.g., a program operation, an erase operation, or a read operation, of the memory device 2200 under control of a processor 3100.

Data programmed in the memory device 2200 may be outputted through a display 3200 under control of the memory controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 2100, data outputted from the radio transceiver 3300, or data outputted form the input device 3400 is outputted through the display 3200.

In an embodiment, the memory controller 2100 capable of controlling the operation of the memory device 2200 may be embodied as a part of the processor 3100 or a chip provided separately from the processor 3100.

Figure 17:
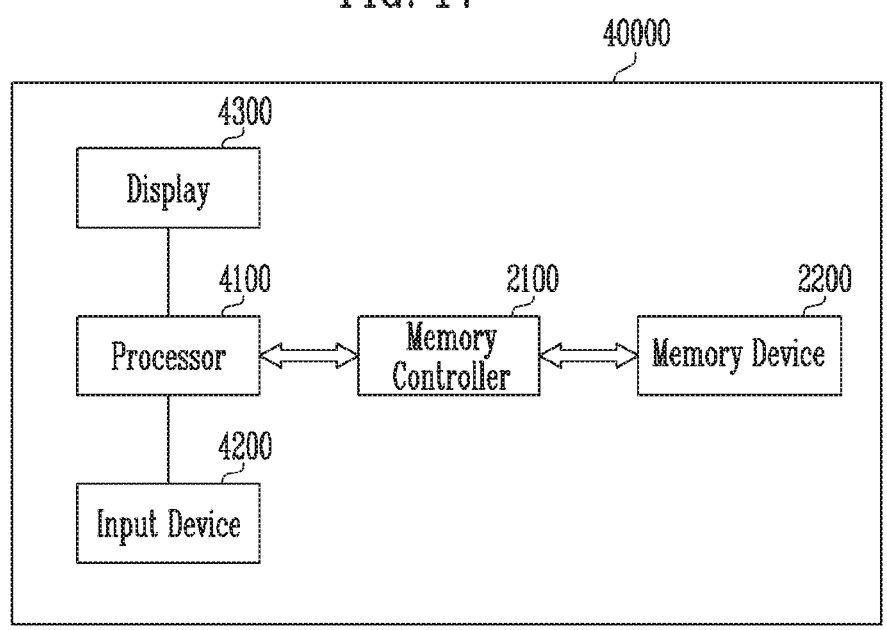
FIG. 17 is a diagram illustrating an example of a memory system including the memory controller shown in FIGS. 1 and 2.

FIG. 17 is a diagram illustrating an example of a memory system 40000 including the memory controller shown in FIGS. 1 and 2.

Referring to FIG. 17, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a memory controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 2100. In an embodiment, the memory controller 2100 capable of controlling the operation of the memory device 2200 may be embodied as a part of the processor 4100 or a chip provided separately from the processor 4100.

Figure 18:
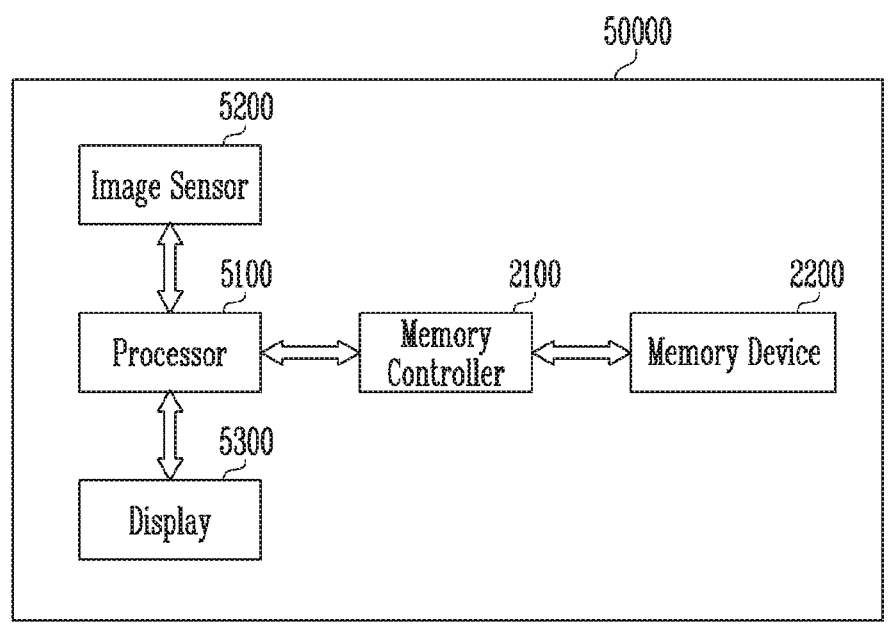
FIG. 18 is a diagram illustrating an example of a memory system including the memory controller shown in FIGS. 1 and 2.

FIG. 18 is a diagram illustrating an example of a memory system 50000 including the memory controller shown in FIGS. 1 and 2.

Referring to FIG. 18, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a memory controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the memory controller 2100. Under control of the processor 5100, the converted digital signals may be outputted through a display 5300 or stored to the memory device 2200 through the memory controller 2100. Data stored in the memory device 2200 may be outputted through the display 5300 under control of the processor 5100 or the memory controller 2100.

In an embodiment, the memory controller 2100 capable of controlling the operation of the memory device 2200 may be embodied as a part of the processor 5100 or a chip provided separately from the processor 5100.

Figure 19:
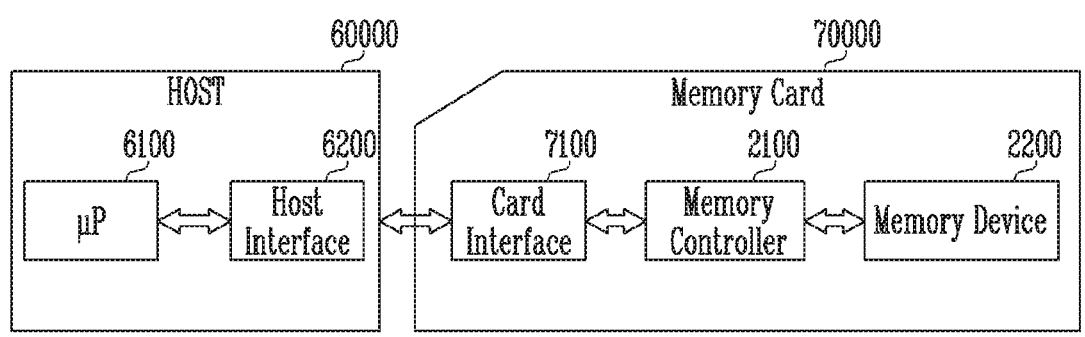
FIG. 19 is a diagram illustrating an example of a memory system including the memory controller shown in FIGS. 1 and 2.

FIG. 19 is a diagram illustrating an example of a memory system 70000 including the memory controller shown in FIGS. 1 and 2.

Referring to FIG. 19, the memory system 70000 may be embodied in a memory card or a smart card. The memory system 70000 may include a memory device 2200, a memory controller 2100, and a card interface 7100.

The controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the memory controller 2100 under control of a microprocessor (μP) 6100.

Figure 20:
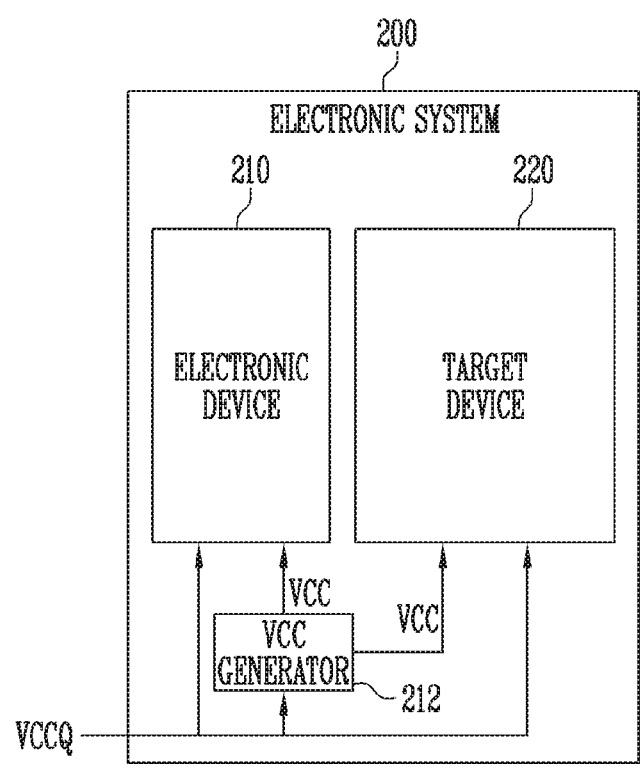
FIG. 20 is a diagram for explaining an electronic system to which embodiments of the present disclosure may be applied.

FIG. 20 is a diagram for explaining an electronic system 200 to which embodiments of the present disclosure may be applied.

Referring to FIG. 20, the electronic system 200 to which embodiments of the present disclosure may be applied may include an electronic device 210 and a target device 220.

At least one of the electronic device 210 and the target device 220 may operate using a voltage supplied thereto, and perform various operations for processing, transmit/receiving, or storing information. To this end, at least one of the electronic device 210 and the target device 220 may include at least one of a processor, a storage, an input/output interface, and a voltage supply unit. In an embodiment, the electronic device 210 may perform an operation which may be performed by the memory controller 2100 of FIGS. 1 and 2. To this end, the electronic device 210 may include the entirety or at least a part of the configuration of the memory controller 2100 of FIG. 2. In an embodiment, the target device 220 may perform an operation which may be performed by the memory device 2200 of FIGS. 1 to 3. To this end, the target device 2200 may include the entirety or at least a part of the configuration of the memory device 2200 of FIG. 3.

The electronic device 210 may perform operation control of the target device 220. To this end, the electronic device 210 may generate at least one of a command, an address, and data and transmit it to the target device 220. This is the same as the operation of the memory controller 2100 described with reference to FIGS. 1 and 2; therefore, detailed description thereof will be omitted.

The electronic device 210 may monitor an external voltage VCCQ and an internal voltage VCC which are supplied to the memory device 220, and may determine whether voltage abnormality has occurred or the abnormal voltage has been recovered into a normal range. The internal voltage VCC may be a voltage generated from the external voltage VCCQ by the VCC generator 212. This is the same as the operation of the memory controller 2100 described with reference to FIGS. 1 and 2; therefore, detailed description thereof will be omitted.

The electronic device 210 may manage the operation proceeding status information, and may check, with reference to the operation proceeding status information, the kind of the operation control, which is being performed for the operation of the target device 220 at the time of the occurrence of the voltage abnormality. This is the same as the operation of the memory controller 2100 described with reference to FIGS. 1 and 2; therefore, detailed description thereof will be omitted.

The electronic device 210 may re-perform the operation control being performed on the target device 220 at the time of the occurrence of the voltage abnormality. This may be performed after a preset time passes from the time of the occurrence of the voltage abnormality, or may be performed after the voltage abnormality has been removed. This is the same as the operation of the memory controller 2100 described with reference to FIGS. 1 and 2; therefore, detailed description thereof will be omitted.

In accordance with the present disclosure, the operation of a target device may be controlled whether voltage abnormality has occurred in the target device, so that the reliability of an electronic system may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising:
a voltage manager configured to determine whether a voltage abnormality occurs by monitoring a voltage to be supplied to a target device; and
an operation manager configured to perform an operation control of the target device, and re-perform, in response to the voltage manager determining that the voltage abnormality has occurred, the operation control being performed at a time of the occurrence of the voltage abnormality,
wherein the operation manager re-transmits a command to the target device, in response to the voltage abnormality occurring while the command required for the operation control of the target device is being transmitted to the target device, and
wherein the operation manager re-transmits the command and an address to the target device, in response to the voltage abnormality occurring while the address is being transmitted to the target device after the command required for the operation control of the target device is transmitted to the target device.

2. The electronic device according to claim 1, wherein the operation manager re-performs the operation control after a preset time passes from the time of the occurrence of the voltage abnormality, or in response to the voltage being recovered to a normal range.

3. The electronic device according to claim 1, wherein the voltage includes at least one of an external voltage to be used to transmit/receive at least one of a command, an address, and data between the electronic device and the target device, and an internal voltage to be used when the target device performs an operation in response to at least one of the command, the address, and the data.

4. The electronic device according to claim 3, wherein, in response to the voltage abnormality occurring in the external voltage while data is being transmitted to the target device after a command and an address required for the operation control of the target device are transmitted to the target device, the operation manager re-transmits the command, the address, and the data to the target device.

5. The electronic device according to claim 3, wherein, in response to the voltage abnormality occurring in the external voltage occurs or the internal voltage after at least one of a command, an address, and data required for the operation control of the target device is transmitted to the target device, the operation manager re-performs the operation control of the target device according to a status of the target device at the time of the occurrence of the voltage abnormality.

6. The electronic device according to claim 5, wherein, when the status indicates that the target device is currently performing an operation in response to the command transmitted to the target device, the operation manager re-transmits at least one of the command, the address, and the data to the target device.

7. The electronic device according to claim 5, wherein, when the status indicates that the target device is not currently performing an operation in response to the command transmitted to the target device, the operation manager does not re-transmit the command, the address, and the data to the target device.

8. The electronic device according to claim 1, wherein the target device comprises a memory device.

9. A memory system comprising:
a memory device configured to store data; and
a memory controller configured to determine whether a voltage abnormality occurs by monitoring a voltage to be supplied to the memory device while performing an operation control of the memory device, and re-perform, in response to the voltage abnormality having occurred, the operation control being performed at a time of the occurrence of the voltage abnormality
wherein the memory controller re-transmits a command to the memory device, in response to the voltage abnormality occurring while the command required for the operation control of the memory device is being transmitted to the memory device, and
wherein the memory controller re-transmits the command and an address to the memory device, in response to the voltage abnormality occurring while the address is being transmitted to the memory device after the command required for the operation control of the memory device has been transmitted to the memory device.

10. The memory system according to claim 9, wherein the memory controller re-performs the operation control after a preset time passes from the time of the occurrence of the voltage abnormality, or in response to the voltage being recovered to a normal range.

11. The memory system according to claim 9, wherein the voltage includes at least one of an external voltage to be used to transmit/receive at least one of a command, an address, and data between the memory controller and the memory device, and an internal voltage to be used when the memory device performs an operation in response to at least one of the command, the address, and the data.

12. The memory system according to claim 11, wherein, in response to the voltage abnormality occurring in the external voltage while data is being transmitted to the memory device after a command and an address required for the operation control of the memory device are transmitted to the memory device, the memory controller re-transmits the command, the address, and the data to the memory device.

13. The memory system according to claim 11, wherein, in response to the voltage abnormality occurring in the external voltage or the internal voltage after at least one of a command, an address, and data required for the operation control of the memory device is transmitted to the memory device, the memory controller re-performs the operation control of the memory device according to a status of the memory device at the time of the occurrence of the voltage abnormality.

14. The memory system according to claim 13, wherein, when the status indicates that the memory device is currently performing an operation in response to the command transmitted to the memory device, the memory controller re-transmits at least one of the command, the address, and the data to the memory device.

15. The memory system according to claim 13, wherein, when the status indicates that the memory device is not currently performing an operation in response to the command transmitted to the memory device, the memory controller does not re-transmit the command, the address, and the data to the memory device.

16. A method of operating a memory controller, the method comprising:
performing operation control of a memory device;
determining whether voltage abnormality occurs by monitoring a voltage to be supplied to the memory device; and
re-performing the operation control in response to the voltage abnormality having occurred while the operation control is being performed,
wherein the re-performing the operation control comprises re-transmitting a command to the memory device, in response to the voltage abnormality occurring while the command required for the operation control of the memory device is being transmitted to the memory device, and
wherein the re-performing the operation control comprises re-transmitting the command and an address to the memory device, in response to the voltage abnormality occurring while the address is being transmitted to the memory device after the command required for the operation control of the memory device has been transmitted to the memory device.

* * * * *